(12) United States Patent
Lee et al.

(10) Patent No.: US 6,869,500 B2
(45) Date of Patent: Mar. 22, 2005

(54) METHOD FOR PROCESSING A WAFER AND APPARATUS FOR PERFORMING THE SAME

(75) Inventors: Kwang-Myung Lee, Suwon-si (KR); Mikio Takagi, Suwon-si (KR); Jae-Hyuk An, Suwon-si (KR); Seung-Ki Chae, Seoul (KR); Jea-Wook Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/236,939

(22) Filed: Sep. 9, 2002

(65) Prior Publication Data

US 2003/0060030 A1 Mar. 27, 2003

(30) Foreign Application Priority Data

Sep. 25, 2001 (KR) ........................................ 2001-59323

(51) Int. Cl.[7] .......................... H05H 1/00; C23C 16/00
(52) U.S. Cl. ............................ 156/345.37; 156/345.52; 156/345.53; 118/724
(58) Field of Search ................... 156/345.37, 345.53, 156/345.52, 345.35; 118/724, 730, 733, 723 MW, 723 ME, 723 IR (56) References Cited

U.S. PATENT DOCUMENTS

| | | | |
|---|---|---|---|
| 5,011,794 A | | 4/1991 | Grim et al. |
| 5,015,330 A | * | 5/1991 | Okumura et al. ............ 438/694 |
| 5,314,541 A | * | 5/1994 | Saito et al. ................. 118/725 |
| 5,328,558 A | | 7/1994 | Kawamura ................... 156/643 |
| 5,346,555 A | * | 9/1994 | Nunotani et al. ........... 118/724 |
| 5,584,963 A | | 12/1996 | Takahashi |
| 5,636,320 A | * | 6/1997 | Yu et al. ...................... 392/416 |
| 6,015,724 A | | 1/2000 | Yamazaki .................... 438/151 |
| 6,225,218 B1 | | 5/2001 | Yamazaki et al. .......... 438/660 |
| 6,255,151 B1 | | 7/2001 | Fukuda et al. .............. 438/197 |
| 6,265,778 B1 | | 7/2001 | Tottori ........................ 257/758 |
| 6,352,593 B1 | * | 3/2002 | Brors et al. ................. 118/724 |

FOREIGN PATENT DOCUMENTS

| | | |
|---|---|---|
| DE | 690 20 802 T2 | 12/1995 |
| DE | 44 17 205 C2 | 10/1998 |
| JP | 1-068920 | 3/1989 |
| JP | 6053141 | 2/1994 |

OTHER PUBLICATIONS

Abrosimova, et al., "Fast thermal diffusion of zinc . . . ", SEMICONDUCTORS, 28(11):1118–1120, (Nov. 1994).

* cited by examiner

*Primary Examiner*—Parviz Hassanzadeh
(74) *Attorney, Agent, or Firm*—Lee, Sterba & Morse, P.C.

(57) ABSTRACT

Disclosed are a method and an apparatus for processing a wafer in manufacturing a semiconductor device and a method and an apparatus for etching a material formed on the wafer, wherein first and second cooling parts adjust an ambient temperature near a plurality of wafers to a first temperature, the wafers are processed by introducing a reaction gas at the first temperature, then, a heating part rapidly raises the temperature of the atmosphere near the wafers from the first temperature to the second temperature to partially separate by-products produced during the processing, the second temperature is maintained to separate most of the by-products from the wafers, and the processing steps are implemented in-situ within the same space. Accordingly, a native oxide layer formed on several wafers can be etched and the reaction by-products can be removed in-situ in the same chamber so productivity is improved.

36 Claims, 10 Drawing Sheets

METHOD FOR PROCESSING A WAFER AND APPARATUS FOR PERFORMING THE SAME

BACKGROUND OF THE INVENTION

1. Field of the Invention

The present invention relates to a method for processing a wafer and an apparatus for performing the same. The present invention further relates to a method for etching a wafer and an apparatus for performing the same. More particularly, the present invention relates to a method for processing a material, such as a native oxide layer, formed on a wafer and a method for etching the material.

2. Description of the Related Art

Recently, the design of semiconductor devices has made rapid progress for wide spread use in information media applications such as computers. In particular, this progress has required the semiconductor devices to function at a high operating speed and to have a large storage capacitance. In order to satisfy these requirements, semiconductor devices having an increased density, higher reliability, and a faster response time are under continued development.

The continuous development of manufacturing techniques of a DRAM device has achieved a mass-production of a 256 Mega bit DRAM device and a Giga bit DRAM device. The 256 Mega bit DRAM device and the Giga bit DRAM device include a multi-layered wiring structure.

A multi-layered wiring structure is obtained by sequentially depositing each layer of the multi-layered wiring structure. During the implementation of the stacking process of each layer, the wafer is frequently exposed to the atmosphere. When the wafer is exposed to the atmosphere, silicon present on the wafer reacts with $O_2$ in the atmosphere to form a native oxide layer.

Figure 1:
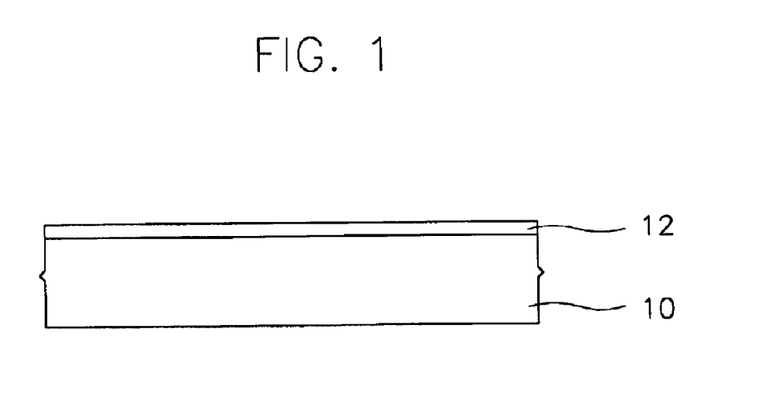
FIG. 1 is a cross-sectional view illustrating a wafer on which a native oxide layer is grown.

FIG. 1 illustrates a wafer 10 on which a native oxide layer 12 is grown. When the wafer 10 makes contact with $O_2$ in the atmosphere, Si composing the wafer 10 reacts with $O_2$ to grow the native oxide layer 12 as shown in FIG. 1. This native oxide layer 12 is grown to a thickness of about several Å on the wafer 10.

The native oxide layer is a factor in inducing a defect during subsequently implemented integrated circuit (IC) processes. It also becomes a cause of increasing contact resistance, which leads to a lowering of an operation speed and the reliability of a semiconductor device.

Figure 2:
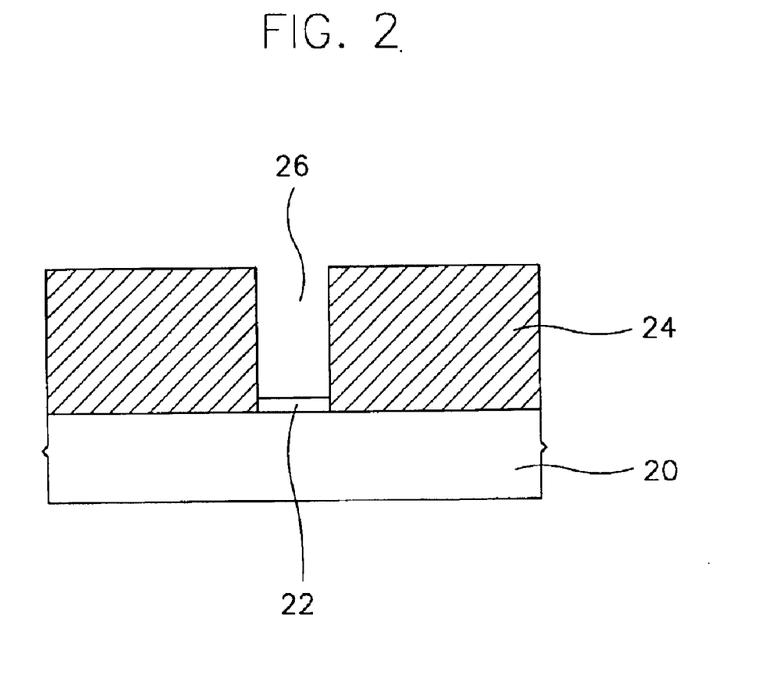
FIG. 2 is a cross-sectional view illustrating a wafer having a contact hole and a native oxide layer grown therein.

FIG. 2 is a cross-sectional view of a wafer 20 having a contact hole 26 and a native oxide layer 22 grown thereon. That is, the native oxide layer 22 is grown through a reaction of silicon with oxygen in the atmosphere at the bottom portion of a contact hole 26 that is formed through a patterning process of an insulating layer 24. Since the native oxide layer leads to an increase in contact resistance, preferably, the native oxide layer is removed.

According to a conventional method for removing the native oxide layer, the native oxide layer is etched by a wet etching method. However, for a contact hole having a high aspect ratio, the etching of the native oxide layer by the wet etching method is not easy. In addition, other structures integrated on the wafer may also be affected by the wet etching method due to some of the chemicals used in the wet etching method.

According to another conventional method for removing the native oxide layer, the native oxide layer is etched by a dry etching method. That is, the native oxide layer is etched using an etching gas. Accordingly, the native oxide in a contact hole having a high aspect ratio can be advantageously etched off. In addition, the etching gas has less effect on the other structures integrated on the wafer as compared to the chemicals used in the wet etching method. Since the wafer is processed through a single wafer-type treatment method according to the dry etching method, however, the processing efficiency of the etching of the native oxide layer is very low.

Recently, a pre-treating method, which is implemented after formation of a thin native oxide film on the wafer and before a subsequent process for restraining the growth of the native oxide layer, has been reported. That is, the pre-treating method for restraining the growth of the native oxide layer is implemented within a same space (for example, a chamber) used for forming the thin film before carrying out the subsequent process.

According to a conventional pre-treating method, a thin film is formed on a wafer and then a heat treatment and a cooling are subsequently implemented to restrain the growth of the native oxide layer on the thin film within the same space used for forming the thin film. According to another conventional pre-treating method, a chamber including a cooling unit and a heater therein for forming a thin film is disclosed. The growth of the native oxide layer can be restrained by subsequently implementing a heat treatment and a cooling within the same chamber after forming the thin film on the wafer.

The growth of the native oxide layer, however, cannot be completely restrained through implementing the pre-treating process steps. When the thin film makes contact with $O_2$ in the atmosphere, the growth of the native oxide layer is inevitable. In addition, according to the conventional methods described above, all of the elements for carrying out the pre-treatment are installed within the same chamber used for forming the thin film. However, the chamber has a spatial limitation and so the manufacturing cost of the chamber increases.

Therefore, a novel method for improving the productivity of the wafer treatment step with a minimization in the spatial restriction is required.

SUMMARY OF THE INVENTION

In an effort to solve the aforementioned problems, a first feature of an embodiment of the present invention provides a method for processing a semiconductor wafer, in which a plurality of wafers are heat-treated within the same space (for example, a chamber).

A second feature of an embodiment of the present invention provides an apparatus for processing a semiconductor wafer, in which a plurality of wafers may be processed within the same space.

A third feature of an embodiment of the present invention provides a method for etching an optional material formed on a plurality of wafers within the same space.

A fourth feature of an embodiment of the present invention provides an apparatus for etching, which is appropriate for implementing the above-described etching method.

In an embodiment of the present invention, there is provided a method for processing a wafer including adjusting an ambient temperature near a wafer to a first temperature; introducing a reaction gas onto the wafer at the first temperature for processing the wafer; rapidly raising the ambient temperature near the wafer to a second temperature higher than the first temperature for partially separating by-products produced during the processing of the wafer from the wafer; and maintaining the second temperature for separating most of the by-products from the ambient of the wafer, wherein all of the above processes are implemented in-situ within the same space (for example, a chamber).

In another embodiment of the present invention an apparatus for processing a wafer includes a first chamber for receiving a wafer therein; a second chamber for receiving the first chamber therein, with an inner surface of the second chamber facing an outer surface of the first chamber for forming an adiabatic vacuum space in-between the second chamber and the first chamber; a heating means for providing the first chamber with a radiant heat to heat the first chamber; a first cooling means provided at an outer portion of the first chamber for cooling the first chamber; and a second cooling means installed in the first chamber for cooling the wafer and the first chamber.

According to the present invention, a wafer is processed by adjusting the temperature appropriately within the same space. Particularly, since a plurality of wafers may be processed simultaneously, a producing efficiency is improved.

In an embodiment of the present invention there is provided a method for etching a predetermined layer formed on a wafer including adjusting a temperature in a chamber, in which a plurality of wafers on which a predetermined material layer is formed are introduced, to a temperature of about 15 to 30° C. suitable for etching the predetermined material layer; introducing an etching gas into the chamber at a temperature of about 15 to 30° C. for dry etching the predetermined material layer formed on the wafer; rapidly raising the temperature in the chamber to a temperature of about 100 to 200° C. for heating the wafer to partially vaporize by-products produced during implementing the dry etching step and to drive out the by-products from an ambient of the wafer; maintaining the temperature in the chamber at about 100 to 200° C. for vaporizing and driving out the by-products from the ambient of the wafer and from an inner portion of the chamber; and lowering and re-adjusting the temperature in the chamber to a temperature of about 15 to 30° C. suitable for implementing the etching, wherein the above processes are implemented in-situ within a same space.

In another embodiment of the present invention an apparatus for processing a wafer further includes a reaction gas introducing line connected to the first chamber for introducing a reaction gas for processing the wafer received in the first chamber; an exhausting line connected to the first chamber for exhausting a by-product produced during processing the wafer using the reaction gas and for evacuating the first chamber. In yet another embodiment of the present invention an apparatus for processing a wafer further includes a load-lock chamber connected to the first chamber for storing a processed wafer and for maintaining the wafer to be received in the first chamber in stand-by; and a transporting means installed under the load-lock chamber for transporting the wafer between the first chamber and the load-lock chamber through an up-and-down driving. In yet another embodiment of the present invention an apparatus for processing a wafer further includes a slot valve between the load-lock chamber and the first chamber for opening and closing of the load-lock chamber to the first chamber; a gate valve at one side of the load-lock chamber to load and unload the boat into and out of the load-lock chamber; and a gas introducing line and a gas exhausting line connected to the load-lock chamber to maintain atmospheric pressure or vacuum in the load-lock chamber.

In still another embodiment of the present invention an apparatus for etching a predetermined layer formed on a wafer includes a first chamber for receiving a boat on which a plurality of wafers are loaded and for receiving an etching gas to etch a predetermined material formed on the wafer; a second chamber for receiving the first chamber, an inner surface of the second chamber facing an outer surface of the first chamber to form an adiabatic vacuum space in-between the first and the second chambers; a heating means provided at an inner surface of the second chamber for heating the first chamber and the wafer; a first cooling means provided at an outer surface of the first chamber for cooling the first chamber; a second cooling means provided in the first chamber for cooling the first chamber and the wafer; a rotating means for rotating the boat for uniformly heating and cooling the wafers loaded on the boat; a load-lock chamber connected to the first chamber for storing and maintaining the boat in stand-by; and a transporting means provided at the load-lock chamber for transporting the boat between the first chamber and the load-lock chamber. In an another aspect of the present invention an apparatus for etching a predetermined layer formed on a wafer further comprises: a slot valve between the load-lock chamber and the first chamber for opening and closing of the load-lock chamber to the first chamber; a gate valve at one side of the load-lock chamber to load and unload the boat into and out of the load-lock chamber; and a gas introducing line and a gas exhausting line connected to the load-lock chamber to maintain atmospheric pressure or vacuum in the load-lock chamber.

According to the present invention, a predetermined material formed on a plurality of wafers may be easily etched within the same space to maximize production efficiency.

These and other features of the present invention will be readily apparent to those of ordinary skill in the art upon review of the detailed description that follows.

BRIEF DESCRIPTION OF THE DRAWINGS

The above and other features and advantages of the present invention will become readily apparent to those of ordinary skill in the art by reference to the following detailed description when considered in conjunction with the accompanying drawings wherein.

DETAILED DESCRIPTION OF THE INVENTION

Korean Patent Application No. 2001–59323, filed Sep. 25, 2001, and entitled: "Method for Processing Wafer and Apparatus for Performing the Same," is incorporated by reference herein in its entirety.

Hereinafter, the embodiments of the present invention will be described in detail with reference to the accompanying drawings.

Figure 3:
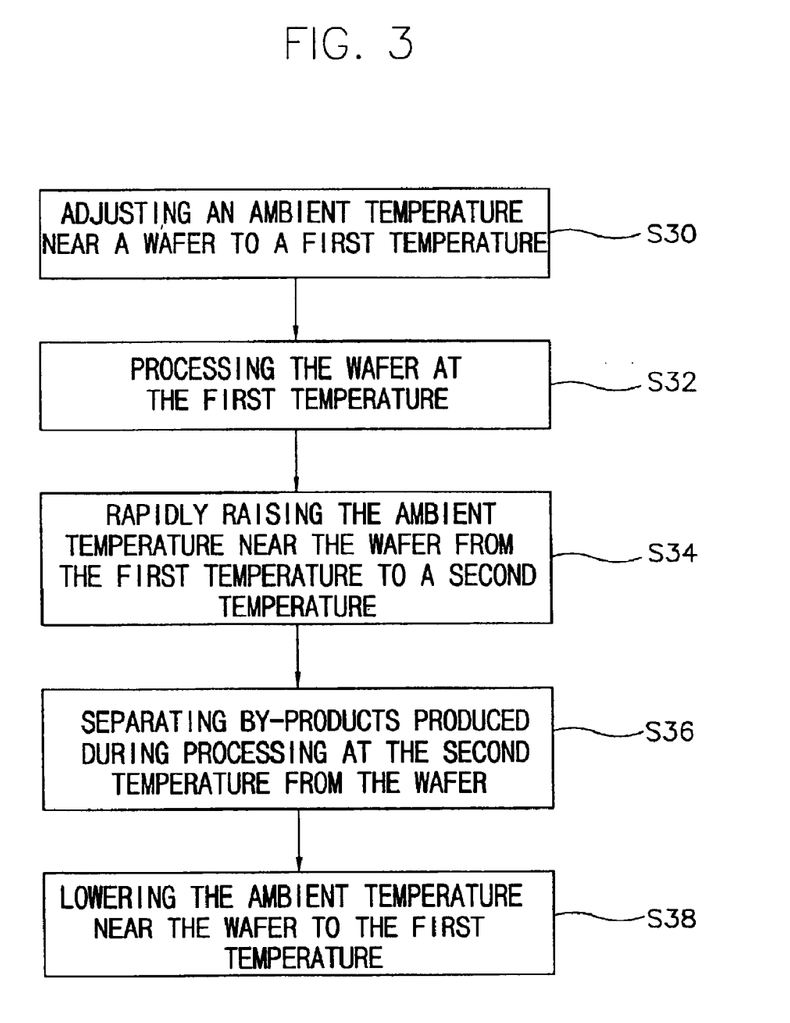
FIG. 3 is a flow chart for a wafer processing method according to an embodiment of the present invention.

FIG. 3 is a flow chart of a wafer processing method according to an embodiment of the present invention.

Referring to FIG. 3, in step S30, an ambient temperature near a wafer is adjusted to a first temperature. Preferably, the first temperature for removing a native oxide layer is adjusted to about 15–30° C. The temperature is adjusted using a cooling agent. As for the cooling agent, liquefied nitrogen, carbon dioxide, water, or the like may be used. Either one cooling agent or a mixture form of more than one cooling agents can be used.

In the next step, S32, the wafer is processed at the first temperature. For example, a material such as a native oxide layer formed on the wafer is etched. The etching of the native oxide layer is, preferably, implemented as follows.

A reaction gas is introduced onto the wafer at the first temperature. The reaction gas is introduced onto the wafer using a carrier gas. The reaction gas is introduced onto the wafer at an excited state using a remote plasma generating device. After exciting the reaction gas as plasma, the excited reaction gas is introduced to etch the native oxide. The reaction gas includes a fluoride-containing compound to facilitate the etching of the oxide. Preferably, the reaction gas includes a fluoride-containing compound such as $NF_3$. As for the carrier gas, nitrogen gas, hydrogen gas, or a mixture thereof can be used. Generally, the native oxide layer formed on the wafer has a thickness of about several Å. Considering the thickness of the native oxide layer, the etching of the oxide layer is implemented for about 20 to 40 seconds, and more preferably for about 30 seconds.

Then, in step S34, the ambient temperature near the wafer is rapidly raised from the first temperature to a second temperature. At this time, by-products produced during processing the wafer (in step S32) are partially removed from the wafer and driven out from the ambient of the wafer. Preferably, the second temperature ranges from about 100 to 200° C. In addition, a rising rate of the temperature used is preferably about 35 to 92.5° C. per minute. The time needed for accomplishing the rapid rise of the temperature from the first temperature to the second temperature is within five minutes, and preferably within two minutes. Preferably, the temperature is raised using a heating source such as a halogen lamp.

Next, in step S36, most of the by-products produced during processing the wafer (in step S32) are separated from the wafer by heating the wafer at the second temperature. If the by-products are not separated from the wafer, the by-products undesirably attach onto the wafer. Therefore, the by-products should be removed through vaporization by heating the wafer. The vaporization step helps to drive out the by-products from the ambient of the wafer and also from the inner portion of the space. Through the implementation of steps S34 and S36, the by-products are completely separated from the wafer. The time required for partially and then fully separating the by-products (sum of the temperature rise time and the second temperature stabilized time) is about 150 to 210 seconds, and more preferably about 180 seconds (3 minutes).

Next, in step S38, the ambient temperature near the wafer is rapidly lowered from the second temperature to the first temperature. Preferably, the first temperature at step S38 is the same as the first temperature at steps S30 and S32. Preferably, the fall rate of the temperature in step S38 is relatively slower than the rising rate of the temperature in step S34. However, considering the maximum cooling efficiency, the temperature lowering rate (or falling rate) is preferably set to about 14 to 37° C. per minute. It is further preferred that the lowering from the second temperature to the first temperature is accomplished as soon as possible. However, the time needed for the lowering of the temperature is adjusted to about five minutes considering the cooling efficiency. For the lowering of the temperature, the same cooling agent used for adjusting the first temperature at step S30 is used. That is, a cooling agent such as liquefied nitrogen, carbon dioxide, or a mixture thereof may be used. In addition, cooling water may also be used. As described above, a thermal stress applied to the wafer at step S36 can be reduced by lowering the temperature to the first temperature.

Steps S30 to S38 are implemented in-situ within the same space. Accordingly, the processing of the wafer is implemented within a space by adjusting the inner temperature appropriately. As a result, the method for processing the wafer according to the present invention may be applied for processing a plurality of wafers simultaneously. For example, about 25 to 100 wafers may be processed simultaneously.

As described above, a plurality of wafers may be processed in-situ within a space through controlling temperature therein appropriately. Accordingly, a producing efficiency of a semiconductor device may be increased.

Figure 4:
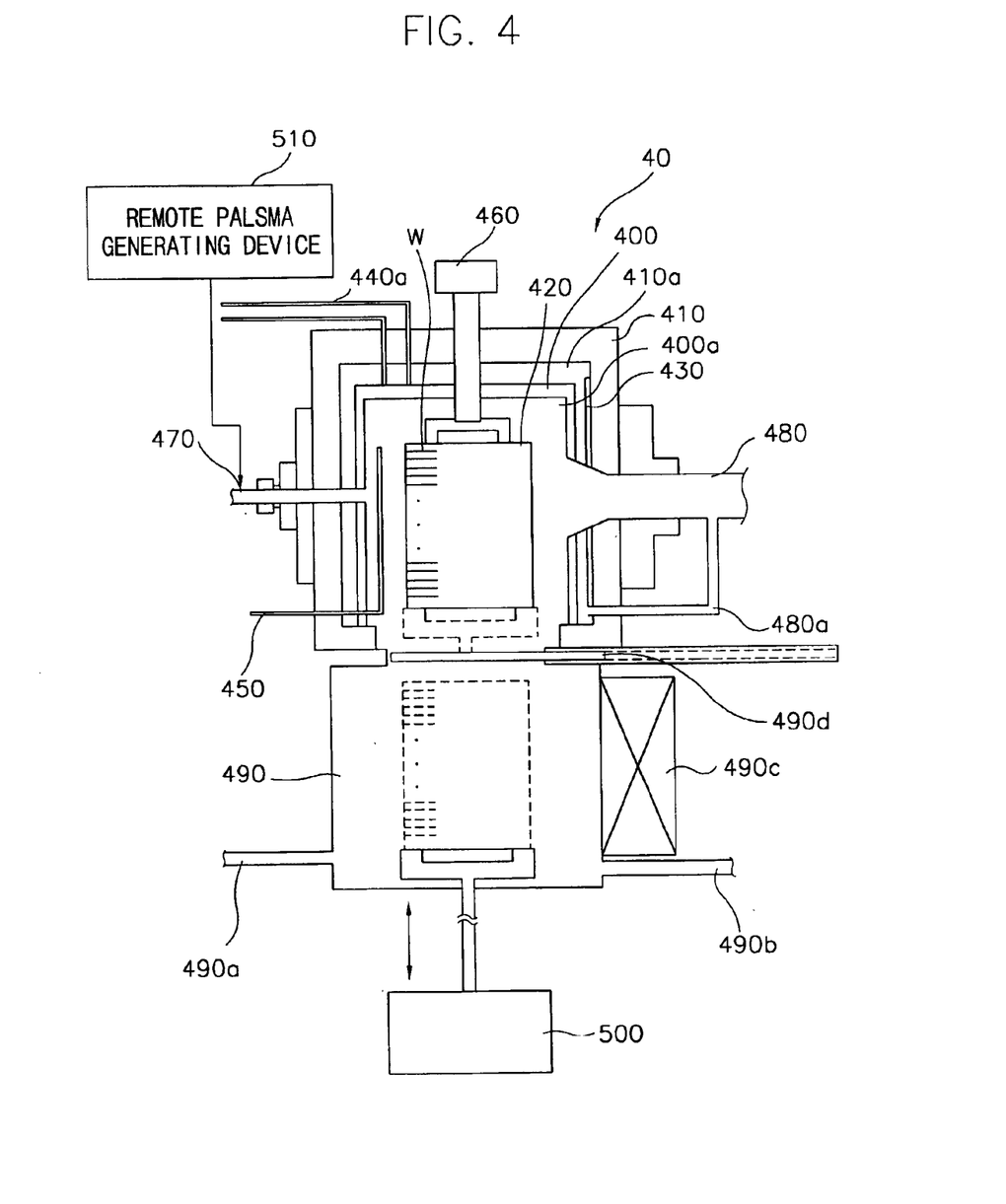
FIG. 4 is a schematic view illustrating an apparatus for processing a wafer according to an embodiment of the present invention.

FIG. 4 is a schematic diagram illustrating an apparatus 40 for processing a wafer W according to an embodiment of the present invention.

Referring to FIG. 4, the apparatus 40 for processing a wafer W includes a first chamber 400 and a second chamber 410. The first chamber 400 includes a receiving space 400a for receiving a wafer W. Alternatively, within the receiving space 400a, a plurality of wafers W may be loaded simultaneously. In particular, a boat 420, into which about 25 to 100 wafers W may be loaded, can be installed in the space 400a.

The second chamber 410 receives and encloses the first chamber 400. Accordingly, an inner portion of the second chamber 410 faces the outer portion of the first chamber 400. An adiabatic vacuum space 410a is formed between the second chamber 410 and the first chamber 400. The adiabatic vacuum space 410a functions to uniformly disperse heat into the receiving space 400a of the first chamber 400 during processing of the wafer W and to restrain release of the heat to the exterior of the second chamber 410.

In addition, the thickness of the wall of the first chamber 400 is preferably thinner than that of the second chamber 410. This may increase the transferring rate of the heat applied into the receiving space 400a of the first chamber 400.

The apparatus 40 includes a heating part 430 for applying heat into the receiving space 400a of the first chamber 400. The heating part 430 is provided at the inner surface of the second chamber 410 in parallel with a central axis of the second chamber 410. Once a radiant heat is generated from the heating part 430 to heat the first chamber 400, the heat is applied into the receiving space 400a and this heat is applied to the wafer W received in the receiving space 400a.

The first chamber 400 and the second chamber 410 are manufactured from a metal having a good heat conductivity such as aluminum and aluminum alloy.

Figure 5:
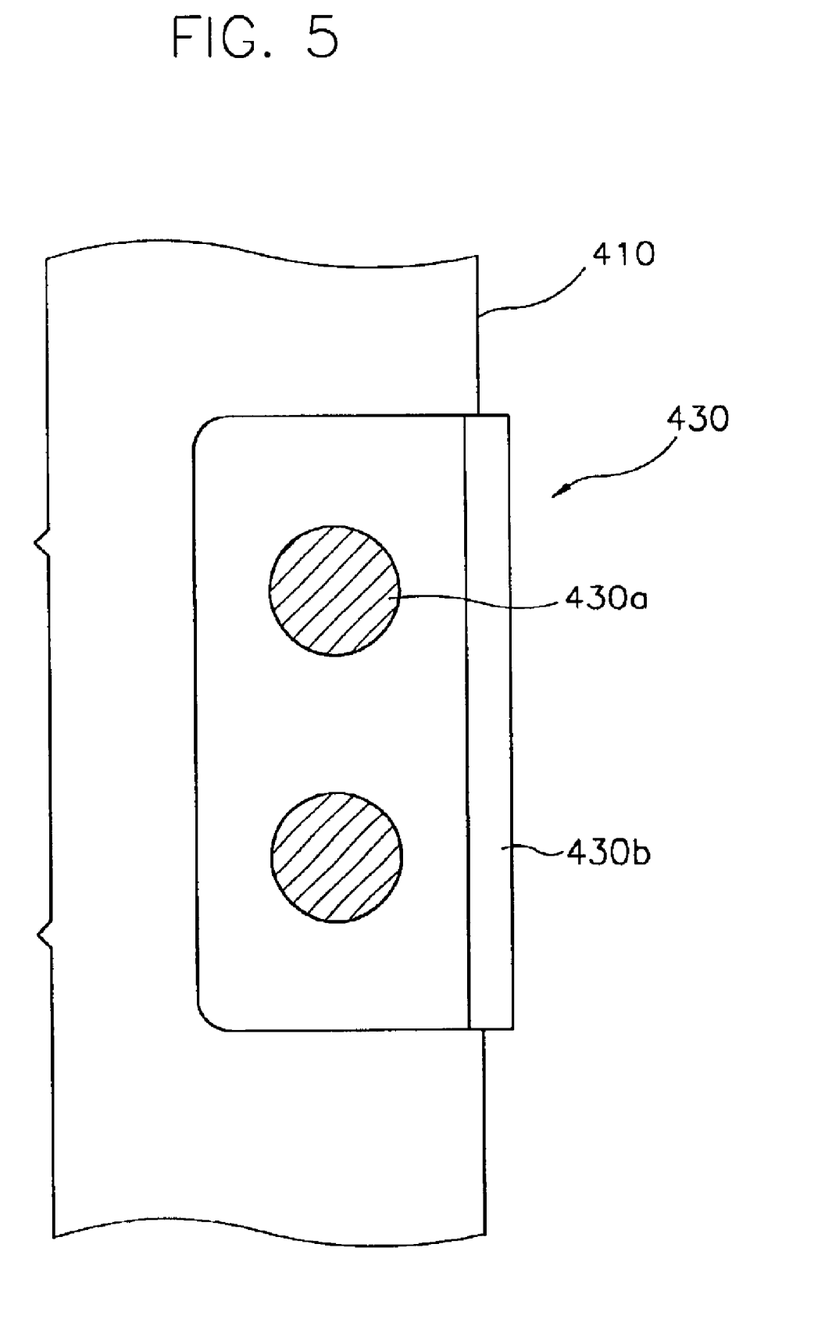
FIG. 5 is a schematic cross-sectional view illustrating a heating part in FIG. 4.

FIG. 5 is a schematic cross-sectional view for illustrating a heating part 430 in FIG. 4. Referring to FIG. 5, the heating part 430 preferably has a structure of a halogen lamp assembly. Typically, the halogen lamp assembly includes a halogen lamp 430a installed in parallel with an axis direction of the second chamber 410. The halogen lamp assembly further includes a cover 430b for covering the halogen lamp 430a. The halogen lamp 430a is protected from the exterior by the cover 430b. The cover 430b is formed-from a heat resistant and transparent material such as quartz. Therefore, the halogen lamp 430a generates the radiant heat and thus generated radiant heat passes the transparent cover 430b to be applied into the first chamber 400.

The heating part 430 is provided at the inner surface of the second chamber 410. In FIG. 5, the halogen lamp assembly preferably includes two halogen lamps 430a. However, the number of the halogen lamps 430a of the heating part 430 may be two or more, limited only by an appropriate amount of heat required into the receiving space 400a of the first chamber 400 to obtain the given process condition. According to another embodiment of the present invention, a portion of the side wall of the second chamber 410 is cut and the heating part 430 is inserted into the cut portion.

The wafer processing apparatus 40 includes a cooling agent circulating line 440a as a first cooling part for cooling the first chamber 400. The cooling agent circulating line 440a can effectively and rapidly lower the temperature in the first chamber 400. As illustrated in FIG. 4, the cooling agent circulating line 440a is provided at the outer surface of the first chamber 400 in parallel with a central axis of the first chamber 400.

Figure 6:
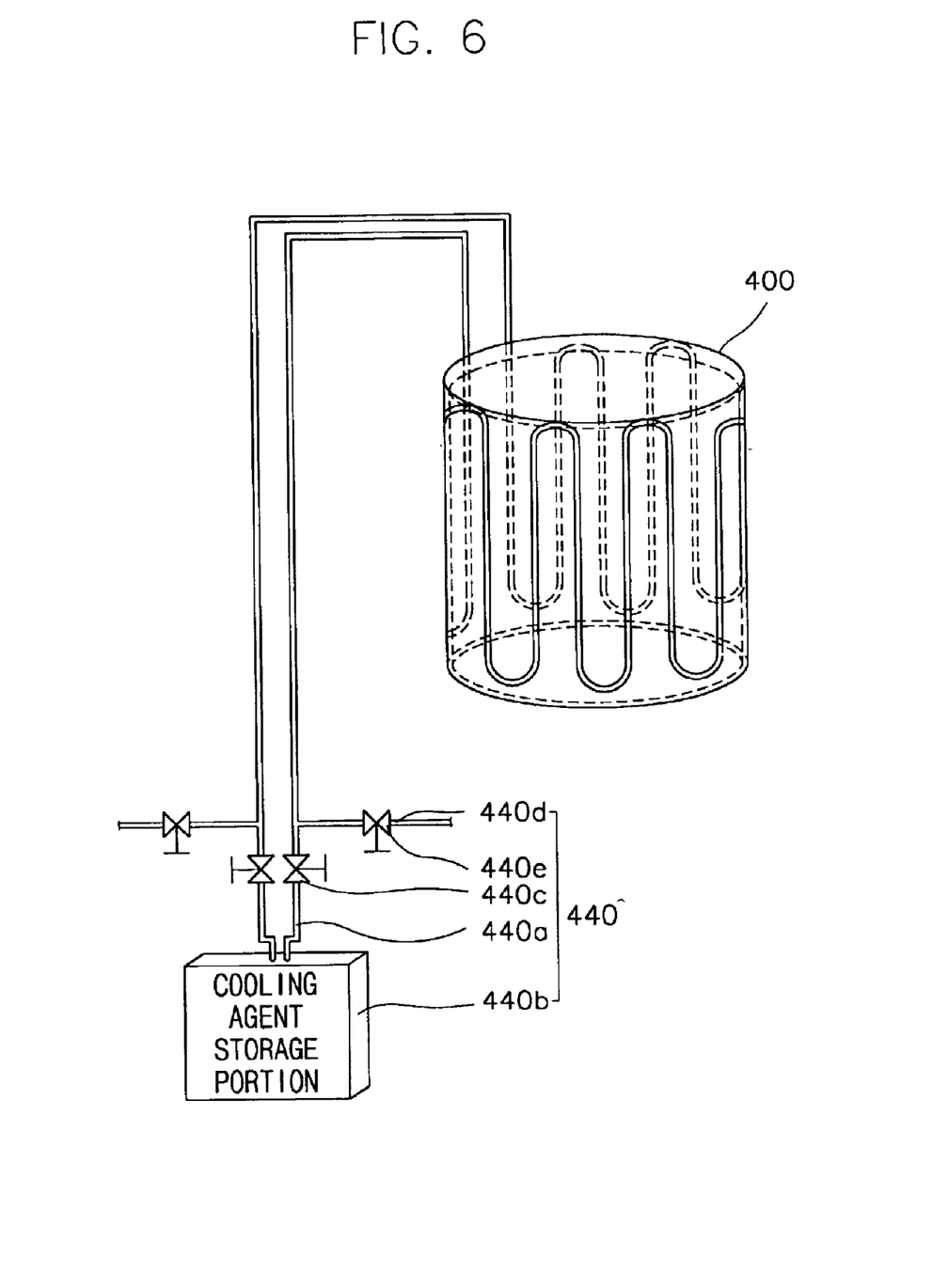
FIG. 6 is a perspective view illustrating an embodiment of a first cooling part installed in the apparatus of FIG. 4.

FIG. 6 is a perspective view of an embodiment of a cooling apparatus 440 including the cooling agent circulating line 440a as a first cooling part. Referring to FIG. 6, the cooling agent circulating line 440a which is the first cooling part, is installed in parallel with an axis direction of the first chamber 400 so that the cooling agent passes through along the axis direction of the first chamber 400. In particular, the cooling agent circulating line 440a includes a plurality of lines provided at the outer surface of the first chamber 400 so that the cooling agent flows along the axis direction of the first chamber 400. Adjacent lines of the cooling agent circulating line 440a are alternately connected at the upper or lower end portions of the first chamber 400 to complete one circulating line 440a, as shown in FIG. 6. According to this embodiment, adjacent lines are alternately connected at the upper or lower end points, however, it is sufficient that at least two adjacent lines are connected at one end portion in order to pass the cooling agent. An inlet for introducing the cooling agent into the cooling agent circulating line 440a and an outlet for exhausting the cooling agent can be formed at one upper or lower end portion of the first chamber 400 by forming the cooling agent circulating line 440a as described above.

According to another embodiment of the present invention, the cooling agent circulating line 400a may be wound around the outer surface of the first chamber 400 as a coil shape. At this time, an inlet of the cooling agent is formed at the upper end portion of the first chamber 400 and an outlet of the cooling agent is formed at the lower end portion.

The cooling apparatus 440 may further include a cooling agent storage portion 440b for storing the cooling agent to be provided to the cooling agent circulating line 440a. In addition, valves 440c for controlling the provision of the cooling agent to the cooling agent circulating line 440 can be further installed. Valves 440c are connected to both inlet and outlet portions of the cooling agent circulating line 440a. When the first chamber 400 is heated, the supply of the cooling agent is restrained by shutting the valves 440c.

By circulating the cooling agent along the cooling agent circulating line 440a, the first chamber 440 can be quickly cooled. That is, the lowering of the temperature of the first chamber 400 and the cooling of the heating part 430 can be simultaneously accomplished using the first cooling part of the cooling agent circulating line 440a.

The cooling apparatus 440 further includes a separated line 440d, which is separated from the cooling agent circulating line 440a and valves 440e installed at the separated line 440d. The separated line 440d furnishes the cooling agent circulating line 440a with a purging gas. If the remaining cooling agent in the first cooling part 440 is completely removed through purging immediately before driving the heating part 430, the heating efficiency of the heating part 430 is maximized. If the cooling agent remains in the first cooling part 440, the heating efficiency of the heating part 430 is somewhat lowered.

Figure 7:
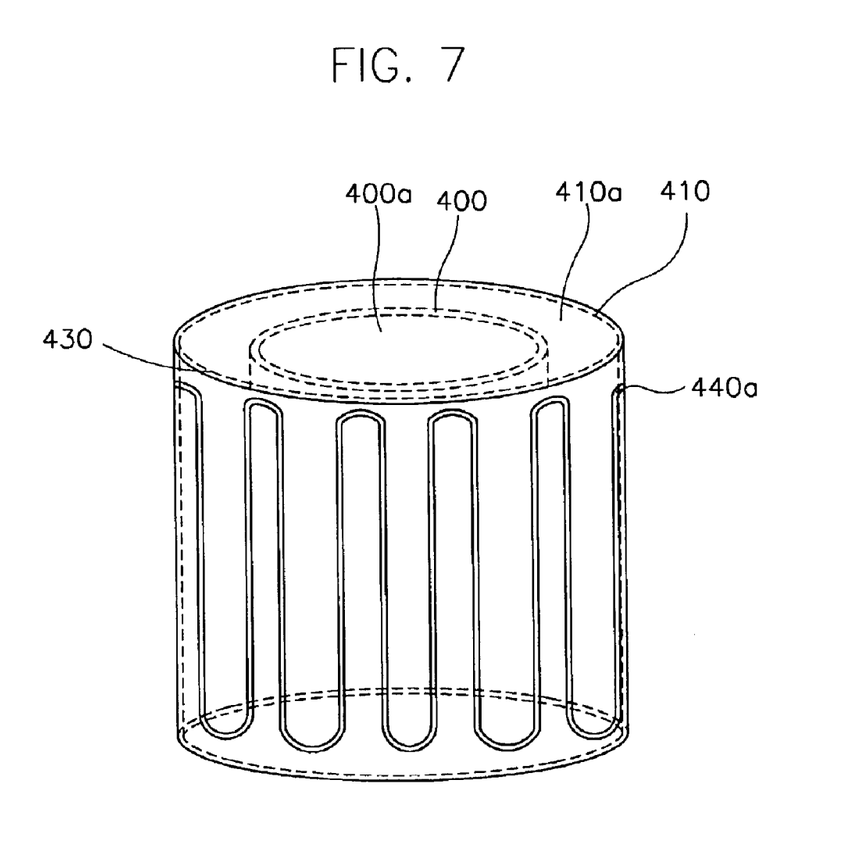
FIG. 7 is a perspective view illustrating a second embodiment of a first cooling part.

FIG. 7 is a perspective view of a second embodiment of a first cooling part 440. Referring to FIG. 7, the first cooling part, that is, the cooling agent circulating line 440a can be provided at the outer surface of the second chamber 410. Once, the cooling agent circulates through the first cooling part 440a, the second chamber 410 is quickly cooled in advance, and then, the second chamber 410 absorbs heat from the first chamber 400 to cool the first chamber 400. As explained above for FIG. 6, the cooling agent circulating line 440a may be installed at the outer surface of the second chamber 410 either in parallel with an axis direction of the first/second chamber as shown in FIG. 7 or wound around the outer surface of the second chamber 410.

According to the second embodiment of the present invention, the cooling agent circulating line 440a can be installed both at the outer surface of the first and second chambers 400 and 410. At this time, the first chamber 400 heated by the heating part 430 and the second chamber 410 to which the heating part 430 is attached can be cooled at the same time to improve the cooling efficiency.

Figure 8:
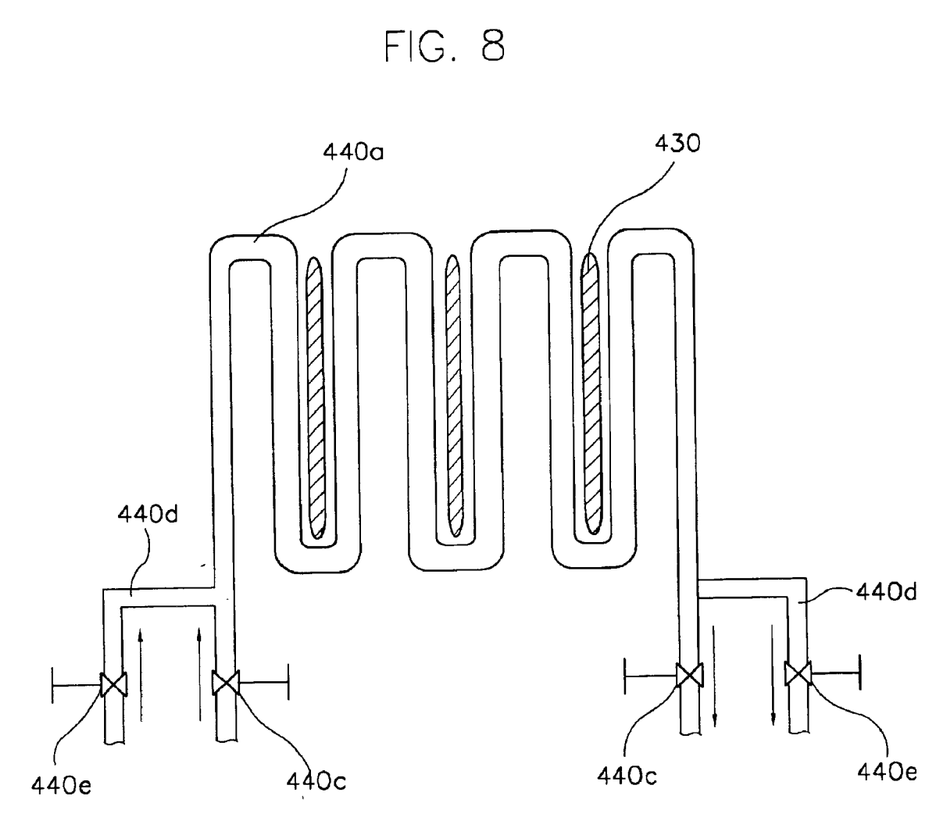
FIG. 8 is a cross-sectional view illustrating another embodiment of a heating part and a first cooling part.

FIG. 8 is a cross-sectional view for illustrating another embodiment of a heating part 430 and a first cooling part 440. Referring to FIG. 8, the cooling agent circulating line 440a of the first cooling means (apparatus) 440 is installed along an axis direction of the heating part 430 and is provided along both sides of the heating part 430 and along upper or lower portion of the heating part 430. The heating part 430 and the cooling agent circulating line 440a of the first cooling part 440 illustrated in FIG. 8 are attached to the second chamber 410. That is, the cooling agent circulating line 440a is wound on the outer surface of the second chamber 410 and then the side wall of the second chamber is cut open. Then, the heating part 430 is provided in the cut portion so that a quartz cover 430b of the heating part 430 faces the outer surface of the first chamber 400. In the drawing, three lamp assemblies used for the heating part 430 are illustrated. As shown in FIG. 8, in order to improve the cooling efficiency with respect to the heating part 430, the cooling agent circulating line 440a is installed to pass over both sides and the lower portion of the heating part 430.

The apparatus for processing a wafer 40 according to the present invention includes a second cooling part 450 to directly lower the temperature of the wafer W received in the first chamber 400. The second cooling part 450 is installed in the first chamber 400 in parallel with the axis direction of the first chamber 400. In addition, the second cooling part 450 is provided near the wafer W in the first chamber 400.

Figure 9:
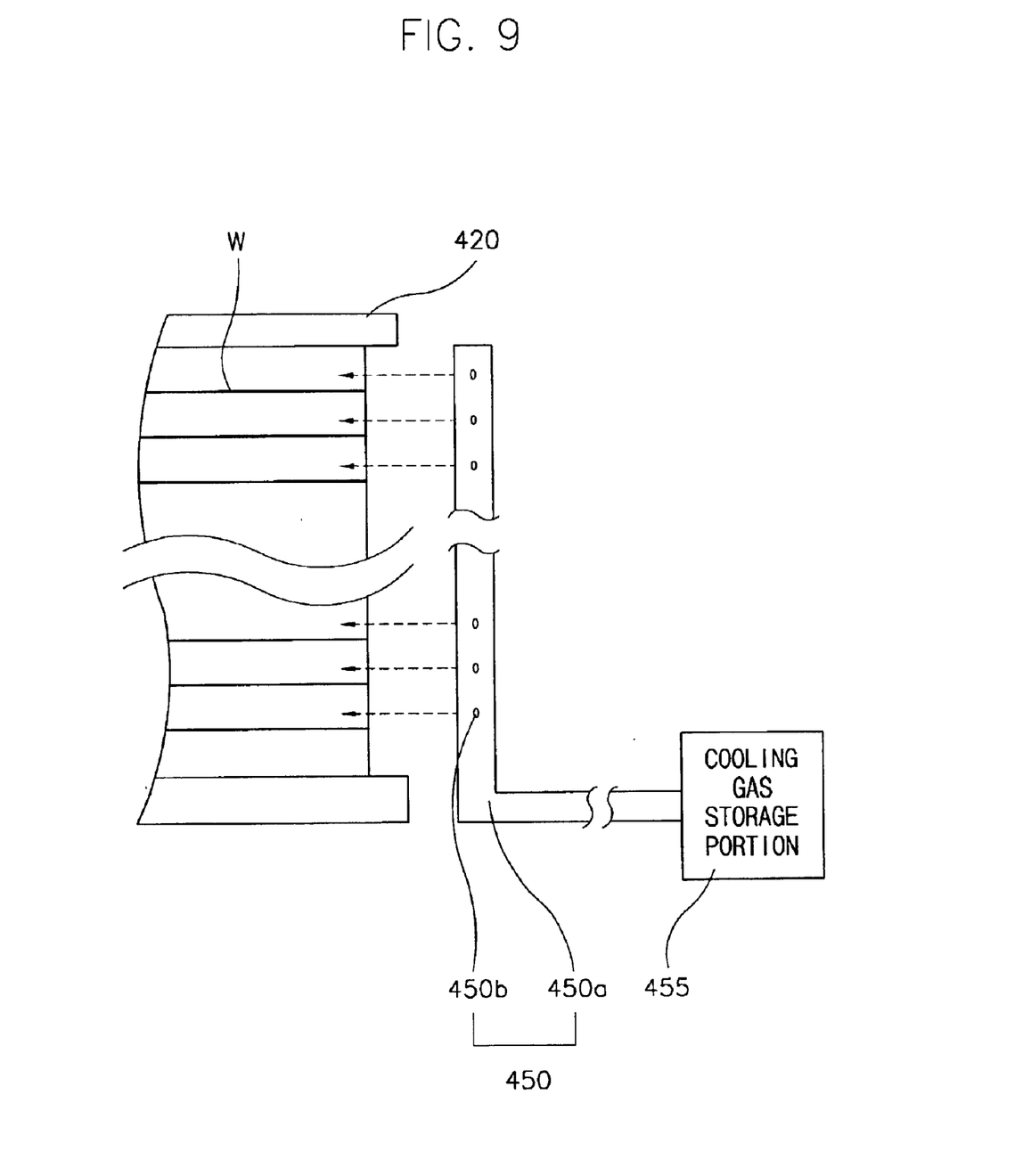
FIG. 9 is a schematic view illustrating a second cooling part installed in the apparatus of FIG. 4.

FIG. 9 is a schematic diagram illustrating a second cooling part 450. Referring to FIG. 9, the second cooling part 450 is provided so that cooling gas is sprayed to the side portions of the wafers W received in the first chamber 400. Typically, the second cooling part 450 includes a spraying nozzle 450a having holes 450b facing the side portions of the wafer W. The spraying nozzle 450a is connected to a cooling gas storage portion 455. The cooling gas provided from the cooling gas storage portion 455 of the second cooling part 450 is sprayed to the side portions of the wafers W through the holes 450b of the spraying nozzle 450a. At this time, the cooling gas is preferably sprayed to the space between the wafers W. The number of spraying nozzles 450a may be two or more. Similarly, the number of holes 450b in each spraying nozzle 450a may be two or more. The position and the number of the spraying nozzles 450a and the holes 450b can be appropriately determined considering the uniformity and the required speed of the cooling of the wafer W.

The temperature of the wafer W can be rapidly raised using the heating part 430 of the wafer processing apparatus 40 according to the present invention. Also, the temperature of the wafer W can be rapidly lowered using the first and the second cooling parts 440a and 450. Accordingly, the plurality of the wafers W loaded on the boat 420 may be advantageously processed.

The wafer processing apparatus 40 may further include a rotating part 460 installed at the upper portion of the first chamber 400 (as shown in FIG. 4). The rotating part 460 fixes the boat 420 received in the first chamber 400 and then rotates the boat 420. The wafer W rotates at a constant speed by means of the rotating part 460 to uniformly transfer the heat applied to the wafer W and to uniformly cool the wafer W.

The apparatus for processing the wafer 40 may further include a reaction gas introducing line 470 and an exhausting line 480 connected to the first chamber 400.

Figure 10:
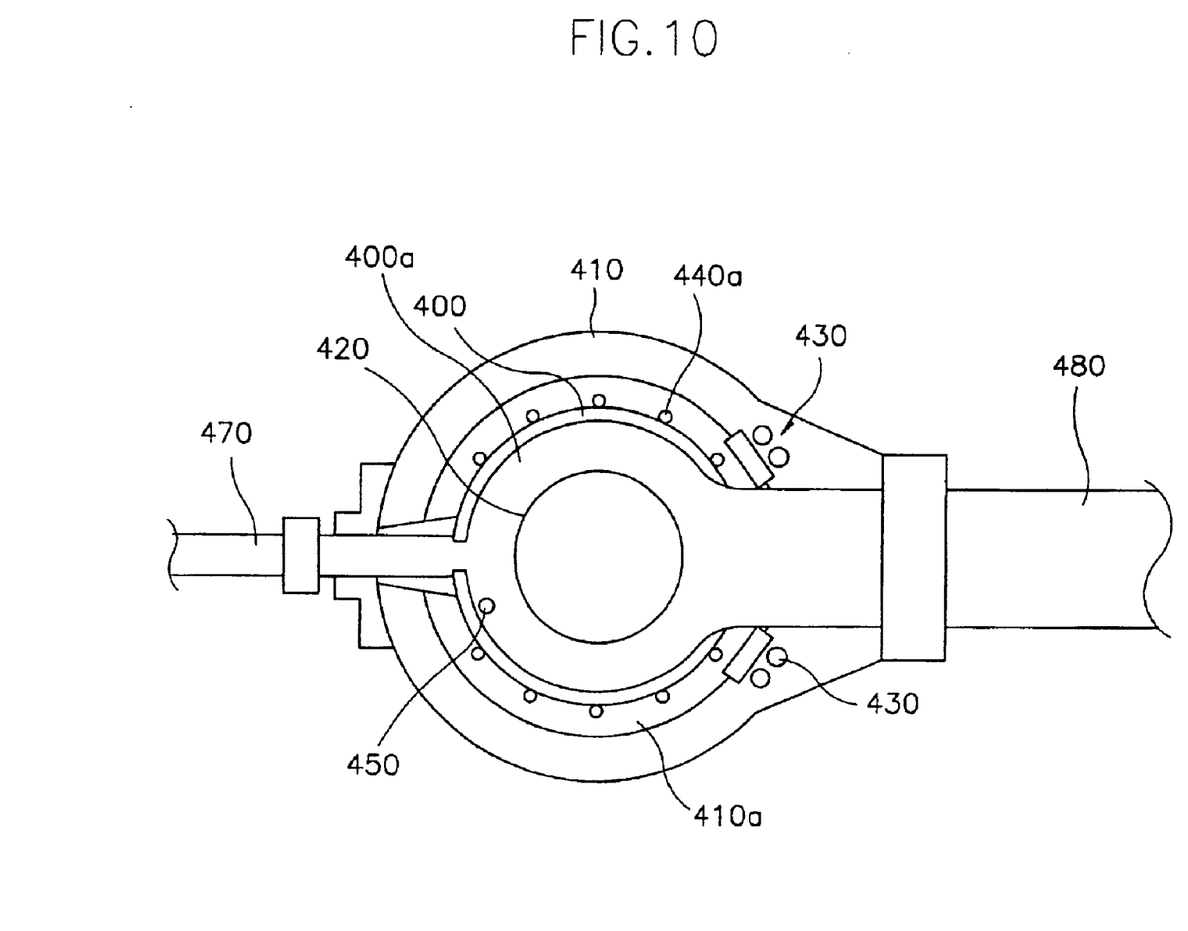
FIG. 10 is a schematic cross-sectional view illustrating a reaction gas introducing line and an exhausting line installed in the apparatus of FIG. 4.

FIG. 10 is a schematic cross-sectional view for explaining a reaction gas introducing line 470 and an exhausting line 480. The reaction gas introducing line 470 is connected to one portion of the first chamber 400 and the reaction gas is introduced into the first chamber 400 through the introducing line 470 when processing the wafer W. The exhausting line 480 is connected to the first chamber 400 at the opposite portion of the introducing line 470, for exhausting by-products produced during processing the wafer W. Particularly, in addition to exhausting out the by-products, the exhausting line 480 functions to achieve vacuum in the receiving space 400a in the first chamber 400. That is, an element for vacuum pumping such as a vacuum pump (not shown) is connected to one side of the exhausting line 480 to achieve vacuum in the receiving space 400a or to exhaust the by-products in the receiving space 400a. The exhausting line 480 may be further provided with an auxiliary exhausting line 480a connected to the adiabatic vacuum space (as shown in FIG. 4). Accordingly, the adiabatic vacuum space 410a also can be evacuated during forming vacuum in the first chamber 400. The exhausting line 480 is preferably installed near the heating part 430 because the by-products can be advantageously exhausted out at a portion of a higher temperature than the peripheral portion at a lower temperature.

The apparatus 40 for processing the wafer may further include a load lock chamber 490 positioned under the first chamber 400. The load lock chamber 490 maintains the wafers W to be received in the first chamber 400 in stand-by and stores processed wafers W. The load lock chamber 490 is provided with a gas introducing line 490a for introducing an atmospheric gas into the load lock chamber 490 during loading and unloading of the wafers and a gas exhausting line 490b for achieving vacuum in the load lock chamber 490. When loading the wafers W into the first chamber 400, the inside of the load lock chamber 490 is made vacuous to accommodate the wafers W to the vacuum environment of the first chamber 400 and vacuum in the first chamber 400 is not broken during loading of the wafers W into the first chamber 400. In addition, when unloading the wafers W from the first chamber 400, the atmospheric gas is introduced through the gas introducing line 490a to form an atmospheric pressure in the load lock chamber 490 to accommodate the wafers W to the exterior environment. Therefore, a stress applied to the wafers W due to a sudden change of the environment can be minimized.

The load lock chamber 490 includes a gate valve 490c provided at one side thereof. The wafers W are transported into the load lock chamber 490 or taken out of the load lock chamber 490 through the gate valve 490c. In addition, the load lock chamber 490 includes a slot valve 490d for implementing opening/closing operation during transporting the wafers W into the first chamber 400. The slot valve 490d is opened during transporting the wafers W while closed during processing the wafers W. The slot valve 490d separates the first chamber 400 and the load lock chamber 490.

The apparatus 40 for processing the wafer is installed under the load lock chamber 490 with a wafer transporting portion 500 for up and down driving of the wafer boat 420. Since the wafer transporting portion 500 moves upwards and downwards, a lifter is preferably utilized. The transporting portion 500 transports a boat on which the wafers W are loaded between the first chamber 400 and the load lock chamber 490.

The apparatus 40 for processing the wafer may include a remote plasma generating device 510 connected to the first chamber 400. The remote plasma generating device 510 excites the reaction gas that is introduced into the first chamber 400. Thus excited reaction gas is introduced upon the wafers W in a plasma state to process the wafers.

By using the apparatus for processing the wafer according to the present invention, a plurality of wafers W can be processed in-situ. Accordingly, when the plurality of wafers W are etched using the processing apparatus, the productivity can be maximized.

According to the method for etching of the present invention, the wafer can be processed by applying the same method for processing the wafer as described above, except that changing a condition on the applying temperature and a plurality of wafers are used. In addition, an apparatus for etching also has a construction similar to the apparatus for processing the wafer.

When an optional material formed on a wafer is etched using the method and apparatus for etching according to the present invention, the productivity can be improved. In particular, when the optional material is a native oxide, the etching method and the etching apparatus according to the present invention are quite appropriate.

During the manufacture of a semiconductor device having a plurality of wiring lines in a structure thereof, an exposure to the atmosphere frequently occurs between process steps.

Hence, a native oxide is grown on the wafer. Since the native oxide becomes a source for generating a failure of the semiconductor device, the native oxide is preferably removed. At this time, the productivity can be maximized when the etching method and the etching apparatus of the present invention is applied to etch the native oxide formed on a plurality of wafers simultaneously. In addition, the etching of the native oxide is accomplished in-situ in the same space, the productivity can be further improved. Since the etching apparatus may be independently installed from other semiconductor processing apparatuses, spatial and economic limitations may be inevitable. However, when compared with the conventional apparatus in which each process function is performed separately by a different apparatus, the spatial and economic limitation is somewhat lessened.

Etching of Native Oxide

An embodiment of etching a native oxide using the etching method and etching apparatus according to the present invention will be described in detail below with reference to FIG. 11.

Figure 11:
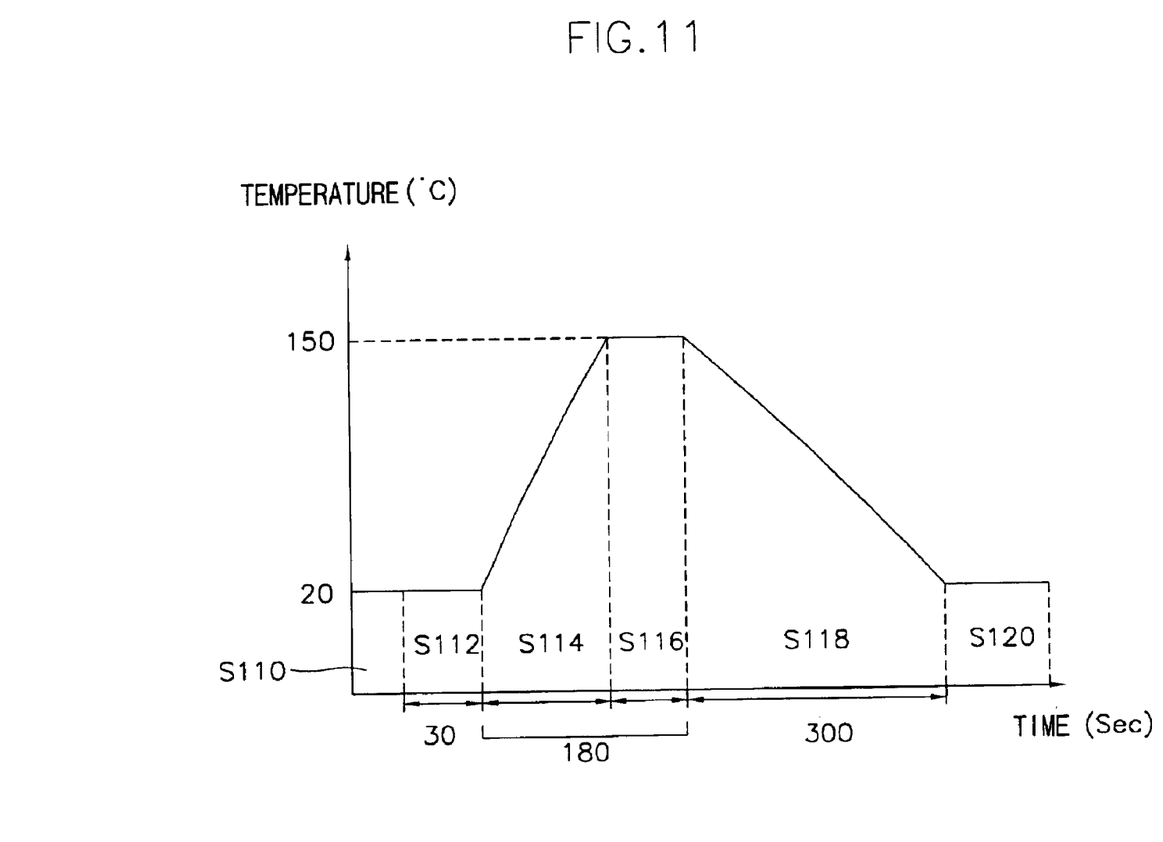
FIG. 11 is a timing chart illustrating a temperature-time cycle for etching a wafer according to an embodiment of the present invention.

FIG. 11 is a timing chart for explaining a temperature change during etching a wafer according to an embodiment of the present invention.

A semiconductor device having a plurality of wiring lines on a wafer is manufactured. The semiconductor device includes the plurality of wiring lines and a contact structure. In order to form the plurality of wiring lines, the wafer is frequently exposed to the atmosphere. Silicon on the wafer makes contact with $O_2$ in the atmosphere and a native oxide is grown at the top portion of the wafer, which also is a bottom portion of the contact.

The wafers W, on which the native oxide is grown, are subsequently loaded on a boat 420. After loading, for example, about 25 to 100 wafers on the boat 420, the boat 420 is transported into a load lock chamber 490 of the etching apparatus 40. In order to introduce the boat 420, on which the wafers W are loaded, into the chamber 490, a gate valve 490c of the load lock chamber 490 is opened. After introducing the boat 420 into the load lock chamber 490, the gate valve 490c is closed. Then, the inner portion of the load lock chamber 490 is evacuated by exhausting through a load lock exhausting line 490b. At this time, the vacuum atmosphere pressure of the load lock chamber 490 is almost at the same degree as that of the first chamber 400 in which an etching is to be implemented.

After achieving the vacuum atmosphere in the load lock chamber 490, the slot valve 490d of the load lock chamber 490 is opened. Next, a transporting part 500 is moved upward to transport the boat 420 into a receiving space 400a of the first chamber 400. Then, the rotating part 460 grasps the upper portion of the boat 420. Next, the transporting portion 500 is moved downward and the slot valve 490d is closed. As a result, the boat 420, on which e.g. 100 wafers W are loaded, is received in the first chamber 400.

Thereafter, the inside of the first chamber 400 in which the boat 420 including the wafers is received achieves vacuum by means of an exhausting line 480. At this time, an adiabatic space 410a between the first and the second chamber 400 and 410 also is exhausted through the auxiliary exhausting line 480a to achieve vacuum.

In step S110, the temperature of the first chamber 400 is adjusted to about 20° C. This temperature is appropriate for implementing an etching operation of the native oxide. At this time, since the boat 420 rotates by means of a rotating part 460, the wafer has a uniform temperature distribution.

The temperature is controlled by a cooling agent, which is circulating within a cooling agent circulating line 440a of the first cooling part. For example, a liquefied nitrogen, liquefied carbon dioxide, or cooling water circulate in the cooling agent circulating line 440a to control the temperature. In addition, a nitrogen gas may be sprayed through a second cooling part 450 to the wafers W loaded on the boat 420 to control the temperature.

Next, an etching gas is introduced into the first chamber 400 through a reaction gas introducing line 470 for etching the native oxide at about 20° C. Accordingly, in step S112, the native oxide formed on the wafer is etched. As for the etching gas a fluoride-containing compound, such as $NF_3$, is used and as for a carrier gas, a mixture gas of nitrogen and hydrogen is used. The etching gas is excited using a remote plasma generating device 510 and then is introduced into the first chamber 400. The etching of the native oxide is implemented for about 30 seconds to etch about several Å of the native oxide formed on the wafer.

After etching the native oxide, in step S114, the cooling agent circulation in line 440a of the first cooling part and the gas spraying through the second cooling part 450 are stopped and the temperature of the first chamber is rapidly raised to about 150° C. At this time, before raising the temperature, remaining cooling agent in the cooling agent circulating line 440a of the first cooling part is completely removed by providing a purging gas through a separated line 440d (shown in FIG. 6). The removal of the cooling agent improves the raising efficiency of the temperature. At this time, the rapid rise in the temperature is accomplished within about 120 seconds. A rising rate of the temperature is about 65° C./min. The rapid rise of the temperature is implemented using a heating part 430. With the rise in the temperature, by-products produced during etching of the native oxide, such as silicon fluoride compounds are vaporized and exhausted out. During the rising of the temperature, by-products are partially separated from the wafer.

In step S116, the first chamber 400 and the wafers are heated at the temperature of 150° C. By maintaining this temperature, most of the by-products produced during etching the native oxide, such as silicon fluoride compounds, are vaporized and exhausted out through the reaction gas exhausting line 480. The by-products are completely separated from the wafer and removed through the exhausting line 480. Therefore, an attachment of the by-products onto the wafer and to the first chamber 400 can be restrained. At this time, the temperature rising time and the maintaining time of the high temperature (time for implementing steps S114 and S116) combined is about 180 seconds.

Thereafter, in step S118, the temperature of the first and second chamber 400 and 410 is rapidly lowered to about 20° C. That is, the temperature is lowered from 150° C. to 20° C. The lowering of the temperature is accomplished by means of the cooling agent circulating line 440a of the first cooling part and the cooling gas spraying of the second cooling part 450. The cooling agent circulates along the cooling agent circulating line 440a of the first cooling part to cool the first chamber 400 and lower the temperature of the inner portion of the first chamber 400. In addition, the wafer W is cooled and the temperature of the inner portion of the first chamber 400 is lowered by spraying the cooling gas to the wafer W through the second cooling part 450. The lowering of the temperature is accomplished within about 300 seconds. At this time, the lowering rate of the temperature is about 26° C./min.

In step S120, the temperature of wafers that completed the etching of the native oxide is stabilized at about 20° C. After completing the etching step, the wafers are carried out of the first chamber 400. With the lowering of the temperature, the slot valve 490d positioned between the first chamber 400 and the load lock chamber 490 is opened. Next, the transporting portion 500 is moved upward to support the boat 420 on which the wafers W are loaded and the boat 420 is separated from the rotating portion 460. The transporting portion 500 is moved downward so that the boat 420 is received in the load lock chamber 490. Then, the slot valve 490d is closed.

Next, an atmospheric gas, such as nitrogen gas is introduced through an atmospheric gas introducing line 490a to maintain the load lock chamber 490 at the atmospheric pressure. While maintaining the atmospheric pressure, a gate valve 490c is opened and the boat 420 holding wafers W is carried out from the load lock chamber 490. By repeating steps S110 to S120, the native oxide formed on a plurality of wafers is etched.

As described above, the native oxide formed on the plurality of wafers can be etched using the method and apparatus for etching of the present invention. In addition, the wafer and the apparatus can be protected from the by-products through an appropriate control of the temperature. In particular, a plurality of wafers can be processed in-situ using the method and apparatus of the present invention. Since the etching of the native oxide is carried out thorough a dry etching method according to the etching method and the etching apparatus of the present invention, damage to the wafer can be minimized.

Therefore, processing of the wafer can be advantageously implemented according to the present invention. In particular, alternating treatments at a room temperature and at a high temperature can be advantageously accomplished in-situ.

In addition, the native oxide formed on the wafer is easily etched. In particular, since the etching of the native oxide is implemented with respect to a plurality of wafers, the productivity is improved. However, the present invention can be applied for the manufacture of a semiconductor device with respect to only one wafer. The method of the present invention is particularly appropriate for use in the manufacture of the recent semiconductor device structure having multiple wiring lines.

Further, since in the conventional process apparatus for processing a wafer and etching are independent, the apparatus of the present invention where both etching and other processing (heating/cooling) can be performed in-situ in the same space may be advantageously incorporated into the manufacture of the semiconductor device. Accordingly, the spatial and economic limitations are minimized.

While preferred embodiments of the present invention have been disclosed herein and, although specific terms are employed, they are used in a generic and descriptive sense only and not for purpose of limitation. Accordingly, it will be understood that the present invention should not be limited to these preferred embodiments but various changes and modifications can be made by one of ordinary skill in the art within the spirit and scope of the present invention as hereinafter claimed.

What is claimed is:

1. An apparatus for processing a wafer comprising:
a first chamber for receiving a wafer therein;
a second chamber for receiving the first chamber therein, an inner surface of the second chamber facing an outer surface of the first chamber for forming an adiabatic vacuum space in-between the second chamber and the first chamber;
a heating means for providing the first chamber with a radiant heat to heat the first chamber;
a first cooling means provided at an outer portion of the first chamber for cooling the first chamber;
a second cooling means installed in the first chamber for cooling the wafer and the first chamber;
a reaction gas introducing line connected to the first chamber for introducing a reaction gas for processing the wafer received in the first chamber; and
an exhausting line connected to the first chamber for exhausting a by-product produced during processing the wafer using the reaction gas and for evacuating the first chamber, wherein the exhausting line is provided with an auxiliary exhausting line connected to adiabatic vacuum space for evacuating the adiabatic vacuum space to a same pressure as the first chamber.

2. An apparatus for processing a wafer as claimed in claim 1, wherein the first cooling means is provided on an outer surface of the first chamber.

3. An apparatus for processing a wafer as claimed in claim 2, wherein the first cooling means includes a plurality of lines aligned along a direction of an axis of the first chamber so as to flow a cooling agent along the direction of the axis of the first chamber, and at least two adjacent lines are connected at one end portion of the first chamber to form a cooling agent circulating system, and the first cooling means further comprises a cooling agent storage portion connected to the cooling agent circulating system and valves provided at the cooling agent circulating line for controlling an in/out flow of the cooling agent.

4. An apparatus for processing a wafer as claimed in claim 3, wherein the adjacent lines in the plurality of lines are alternately connected at the upper or lower end portions of the first chamber.

5. An apparatus for processing a wafer as claimed in claim 3, wherein the cooling agent circulating line is wound around the outer surface of the first chamber as a coil shape with an inlet of the cooling agent formed at the upper end portion of the first chamber and an outlet formed at the lower end portion of the first chamber.

6. An apparatus for processing a wafer as claimed in claim 3, wherein the first cooling means further comprises a separated line from the cooling agent circulating line with valves connected to the separated line for providing a purging gas into the cooling agent circulating line.

7. An apparatus for processing a wafer as claimed in claim 1, wherein the first cooling means is provided at an outer surface of the second chamber with a plurality of lines aligned along the direction of the axis of the second chamber, and at least two adjacent lines are connected at one end portion of the second chamber to form a cooling agent circulating system, and the first cooling means further comprises a cooling agent storage portion connected to the cooling agent circulating system and valves provided at the cooling agent circulating line for controlling an in/out flow of the cooling agent.

8. An apparatus for processing a wafer as claimed in claim 7, wherein the cooling agent circulating line is wound around the outer surface of the second chamber as a coil shape with an inlet of the cooling agent formed at the upper end portion of the second chamber and an outlet formed at the lower end portion of the second chamber.

9. An apparatus for processing a wafer as claimed in claim 7, wherein the first cooling means further comprises a separated line from the cooling agent circulating line with valves connected to the separated line for providing a purging gas into the cooling agent circulating line.

10. An apparatus for processing a wafer as claimed in claim 1, wherein the first cooling means is provided at the outer surfaces of both the first and the second chambers.

11. An apparatus for processing a wafer as claimed in claim 1, wherein the first chamber includes a space for receiving a plurality of wafers and the wafers are received in the first chamber using a boat for loading the wafers.

12. An apparatus for processing a wafer as claimed in claim 1, wherein the first chamber has a thickness thinner than that of the second chamber.

13. An apparatus for processing a wafer as claimed in claim 1, wherein the first chamber and the second chamber are made of a metal having a good thermal conductivity.

14. An apparatus for processing a wafer as claimed in claim 13, wherein the metal is aluminum or an aluminum alloy.

15. An apparatus for processing a wafer as claimed in claim 1, wherein the heating means is a halogen lamp assembly provided at an inner surface of the second chamber in parallel with an axis direction of the second chamber.

16. An apparatus for processing a wafer as claimed in claim 15, wherein the halogen lamp assembly comprises:
   a halogen lamp provided in parallel with the axis direction of the second chamber; and
   a cover for covering and protecting the halogen lamp from an exterior.

17. An apparatus for processing a wafer as claimed in claim 15, wherein a number of halogen lamps in the halogen lamp assembly is two or more.

18. An apparatus for processing a wafer as claimed in claim 15, wherein the halogen lamp assembly has a protective cover made of a heat resistant and transparent material.

19. An apparatus for processing a wafer as claimed in claim 18, wherein the protective cover material is quartz.

20. An apparatus for processing a wafer as claimed in claim 15, wherein a portion of the sidewall of the second chamber is cut and the heating means is inserted into the cut portion.

21. An apparatus for processing a wafer as claimed in claim 1, wherein the first cooling means is installed in an axis direction of the heating means along both sides of the heating means and also along an upper or a lower portion of the heating means with the heating means and a cooling agent circulation line of the first cooling means attached to the second chamber.

22. An apparatus for processing a wafer as claimed in claim 1, wherein the second cooling means is provided in the first chamber in parallel with an axis direction of the first chamber and a temperature of the wafer is lowered by the spraying of a cooling gas toward a side portion of the wafer received in the first chamber.

23. An apparatus for processing a wafer as claimed in claim 22, wherein the second cooling means is a spraying nozzle having holes at positions facing the side portion of the wafer and further comprises a cooling gas storage portion connected to the spraying nozzle for providing the cooling gas to the spraying nozzle.

24. An apparatus for processing a wafer as claimed in claim 23, wherein a number of the spraying nozzles is two or more.

25. An apparatus for processing a wafer as claimed in claim 1, further comprising a rotating means for rotating the wafer received in the first chamber.

26. An apparatus for processing a wafer as claimed in claim 1, further comprising:

a load-lock chamber connected to the first chamber for storing a processed wafer and for maintaining the wafer to be received in the first chamber in stand-by; and
a transporting means installed under the load-lock chamber for transporting the wafer between the first chamber and the load-lock chamber through an up-and-down driving.

27. An apparatus for processing a wafer as claimed in claim 26, further comprising:
   a slot valve between the load-lock chamber and the first chamber for opening and closing of the load-lock chamber to the first chamber;
   a gate valve at one side of the load-lock chamber to load and unload the boat into and out of the load-lock chamber; and
   a gas introducing line and a gas exhausting line connected to the load-lock chamber to maintain atmospheric pressure or vacuum in the load-lock chamber.

28. An apparatus for processing a wafer as claimed in claim 1, wherein the apparatus further comprises a remote plasma generating element connected to the first chamber and the wafer is processed using a remote reaction gas in a plasma state generated by the remote plasma generating element.

29. An apparatus for etching a predetermined layer formed on a wafer, comprising:
   a first chamber for receiving a boat on which a plurality of wafers are loaded and for receiving a reaction gas to etch a predetermined material formed on the wafer;
   a second chamber for receiving the first chamber, an inner surface of the second chamber facing an outer surface of the first chamber to form an adiabatic vacuum space in-between the first and the second chambers;
   a heating means provided at an inner surface of the second chamber for heating the first chamber and the wafer;
   a first cooling means provided at an outer surface of the first chamber for cooling the first chamber;
   a second cooling means provided in the first chamber for cooling the first chamber and the wafer;
   a rotating means for rotating the boat for uniformly heating and cooling the wafers loaded on the boat;
   a load-lock chamber connected to the first chamber for storing and maintaining the boat in stand-by;
   a transporting means provided at the load-lock chamber for transporting the boat between the first chamber and the load-lock chamber;
   a reaction gas introducing line connected to the first chamber for introducing the reaction gas into the first chamber; and
   an exhausting line for exhausting a by-product produced during processing the wafer using the reaction as and for evacuating the first chamber and the adiabatic vacuum space to a same pressure.

30. An apparatus for etching as claimed in claim 29, wherein the first chamber has a thickness thinner than that of the second chamber.

31. An apparatus for etching as claimed in claim 29, further comprising a remote plasma generating device connected to the first chamber for exciting the reaction gas.

32. An apparatus for etching as claimed in claim 29, wherein the heating means is a halogen lamp assembly provided at an inner surface of the second chamber near the exhausting line in parallel with an axis direction of the second chamber.

33. An apparatus for etching as claimed in claim 29, wherein the first cooling means includes a plurality of lines provided along a direction of an axis of the first chamber so as to flow a cooling agent along the direction of the axis of the first chamber, and at least two adjacent lines are connected at one end portion of the first chamber to form a cooling agent circulating system, and the first cooling means further comprises a cooling agent storage portion connected to the cooling agent circulating system and a valve provided at the cooling agent circulating line for controlling an in/out flow of the cooling agent.

34. An apparatus for etching as claimed in claim 33, wherein the first cooling means further comprises a separated line from the cooling agent circulating line with a valve for providing purging gas into the cooling agent circulating line.

35. An apparatus for etching as claimed in claim 29, wherein the second cooling means is a spraying nozzle having at least one hole at a position facing the side portion of the wafer for spraying the cooling gas toward a side portion of the wafer to cool the wafer received in the first chamber, and further comprises a cooling gas storage portion connected to the spraying nozzle for providing the cooling gas to the spraying nozzle.

36. An apparatus for etching as claimed in claim 29, further comprising;

a slot valve between the load-lock chamber and the first chamber for opening and closing of the load-lock chamber to the first chamber;

a gate valve at one side of the load-lock chamber to load and unload the boat into and out of the load-lock chamber; and a gas introducing line and a gas exhausting line connected to the load-lock chamber to maintain atmospheric pressure or vacuum in the load-lock chamber.

* * * * *